United States Patent
Yang et al.

(10) Patent No.: US 6,897,108 B2
(45) Date of Patent: May 24, 2005

(54) PROCESS FOR PLANARIZING ARRAY TOP OXIDE IN VERTICAL MOSFET DRAM ARRAYS

(75) Inventors: Sheng-Wei Yang, Tainan Hsien (TW); Cheng-Chih Huang, Taipei Hsien (TW); Chien-Mao Liao, Taipei Hsien (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 143 days.

(21) Appl. No.: 10/604,361

(22) Filed: Jul. 14, 2003

(65) Prior Publication Data

US 2005/0014331 A1 Jan. 20, 2005

(51) Int. Cl.[7] ...................... H01L 21/8242; H01L 21/20
(52) U.S. Cl. ...................... 438/244; 438/243; 438/386; 438/387
(58) Field of Search ................. 438/243–249, 438/386–392; 257/301–305, 135, E27.096

(56) References Cited

U.S. PATENT DOCUMENTS

| | | | |
|---|---|---|---|
| 6,261,894 B1 * | 7/2001 | Mandelman et al. | 438/238 |
| 6,509,226 B1 * | 1/2003 | Jaiprakash et al. | 438/243 |
| 6,548,344 B1 * | 4/2003 | Beintner et al. | 438/241 |
| 6,620,676 B2 * | 9/2003 | Malik et al. | 438/243 |
| 6,727,540 B2 * | 4/2004 | Divakaruni et al. | 257/301 |
| 6,790,739 B2 * | 9/2004 | Malik et al. | 438/386 |
| 6,821,843 B1 * | 11/2004 | Chen et al. | 438/243 |
| 2001/0023957 A1 * | 9/2001 | Warwick | 257/301 |

FOREIGN PATENT DOCUMENTS

| | | | | |
|---|---|---|---|---|
| JP | 63252467 A | * | 10/1988 | H01L/27/10 |
| JP | 02081472 A | * | 3/1990 | H01L/27/108 |

* cited by examiner

Primary Examiner—Jennifer M. Kennedy
(74) Attorney, Agent, or Firm—Winston Hsu

(57) ABSTRACT

The present invention provides a process for planarizing array top oxide (ATO) in vertical MOSFET DRAM arrays. In contrast to the prior art ARC-RIE planarization method for EA/ES (etch array/etch support) module, the present invention takes advantage of chemical mechanical polishing (CMP) technique to overcome residue problems that used to occur at the transition region or array edge. It might cause capacitor device failure when ATO residue is left on the transition region.

10 Claims, 10 Drawing Sheets

PROCESS FOR PLANARIZING ARRAY TOP OXIDE IN VERTICAL MOSFET DRAM ARRAYS

BACKGROUND OF INVENTION

1. Field of the Invention

The present invention relates generally to a method for fabricating semiconductor memory devices. More specifically, the present invention relates to a process for planarizing the array top oxide (ATO) in vertical metal-oxide-semiconductor field-effect transistor (MOSFET) dynamic random access memory (DRAM) arrays.

2. Description of the Prior Art

Trench-capacitor DRAM devices are known in the art. Typically, a trench-storage capacitor consists of a very-high-aspect-ratio contact-style hole pattern etched into the substrate, a thin storage-node dielectric insulator, a doped low-pressure chemical vapor deposition (LPCVD) polysilicon fill, and buried-plate diffusion in the substrate. The doped LPCVD silicon fill and the buried plate serve as the electrodes of the capacitor. A dielectric isolation collar in the upper region of the trench prevents leakage of the signal charge from the storage-node diffusion to the buried-plate diffusion of the capacitor. DRAM cells using trench-storage capacitors are particularly well suited for the integration of vertical MOSFETs, since a portion of the wall of the trench above the storage capacitor is utilized for the channel, while the bitline wiring is formed above the surface of the silicon substrate. When a transistor is built along the walls of a trench, the channel length is decoupled from the minimum lithographic feature size and the size of the memory cell.

In the present process for memory cell fabrication in vertical MOSFET DRAM arrays, removal of the etch stop nitride liner from the array results in thinning of the underlying top oxide which is intended to provide insulation between the silicon substrate and the word lines to be formed subsequently. Thinning of the top oxide results in a higher than desired incidence of word line to substrate shorts and/or leakage. Furthermore, thinning of the top oxide may result in the formation of divots in the array gate conductor (GC) polysilicon in the top portion of the deep trench, due to gate stack overetch. Divots in the array GC polysilicon which are deeper than the bit line diffusion junction result in non-functional array MOSFETs due to gate underlap.

A known process called ARC-RIE process is typically used to planarize array top oxide (ATO) at the stage after finishing the substrate active area definition and insulations in the middle of fabrication of vertical transistor DRAM devices. In the ARC-RIE process, an anti-reflection coating (ARC) is first coated over the entire surface of the substrate having thereon a plurality of trench capacitors, active areas, and shallow trench isolations (STI). A reflow process is then carried out, followed by reactive ion etching (RIE) to etch away a thickness of the ARC film. However, one problem with the conventional ARC-RIE process is that the height difference at the transition region between the support region and array region cannot be compensated by the ARC-RIE process, thereby generating ATO residue defects, which usually cause word line open. Moreover, the conventional ARC-RIE process cannot overcome poly/nitride stack corrosion during the stripping of pad nitride. This is because silicon nitride of the poly/nitride stack has low resistance to buffer HF (BHF) etchant used to etch pad nitride in the support region, thus leads to poly string problems.

In view of the above discussion, it becomes apparent that there is a need for an improved planarization process at the stage after finishing the substrate active area definition and insulations in the middle of fabrication of vertical transistor DRAM devices to solve the above-mentioned problems.

SUMMARY OF INVENTION

Accordingly, it is a primary objective of this invention to provide an improved method for fabricating a vertical transistor DRAM device, in which the array top oxide is planarized by CMP technique.

Briefly summarized, the preferred embodiment of the present invention discloses a method for fabricating a vertical transistor DRAM device. A semiconductor substrate is provided. The semiconductor substrate comprises a vertical transistor memory array region, a support region, and a transition region between the vertical transistor memory array region and the support region. The vertical transistor memory array region comprises a plurality of vertical transistor memory cells and a plurality of array active areas. The support region comprises a plurality of support active areas isolated from each other by shallow trench isolation regions. A first pad oxide and a first pad nitride are formed on each of the array active areas. A second pad oxide and second pad nitride are formed on each of the support active areas. A protective dielectric layer is deposited over the semiconductor substrate. An etch array (EA) photoresist layer is coated on the protective dielectric layer, so that the EA photoresist layer masks the support region and a portion of the transition region. The protective dielectric layer is etched using the EA photoresist layer as an etching mask to expose the first pad nitride in the vertical transistor memory array region. The EA photoresist layer is then stripped. Using the protective dielectric layer to protect the second pad nitride in the support region, the first pad nitride in the vertical transistor memory array region is removed to form recesses on the array active areas. Spacers are formed on walls of the recesses on the array active areas. A dielectric layer is thereafter deposited to cover the protective dielectric layer on the support region, the vertical transistor memory array region, and the transition region, and the dielectric layer filling the recesses. A chemical mechanical polishing (CMP) process is then carried out to polish the dielectric layer and the protective layer on the support region using the second pad nitride as a polishing stop layer. A silicon layer is deposited over the semiconductor substrate. An etch support (ES) photoresist layer is coated on the silicon layer. The ES photoresist layer masks the vertical transistor memory array region and a portion of the transition region. The silicon layer is etched using the ES photoresist layer as a hard mask to define an array etch mask. The ES photoresist layer is then stripped.

Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The preferred embodiment in accordance with the present invention will be discussed in detail with reference to FIG. 1 to FIG. 10. It is understood that the type of semiconductor regions, device layout, and polarity of voltages are chosen solely for illustration, and persons having ordinary skill in the art would recognize other alternatives, variations, and modifications.

Figure 1:
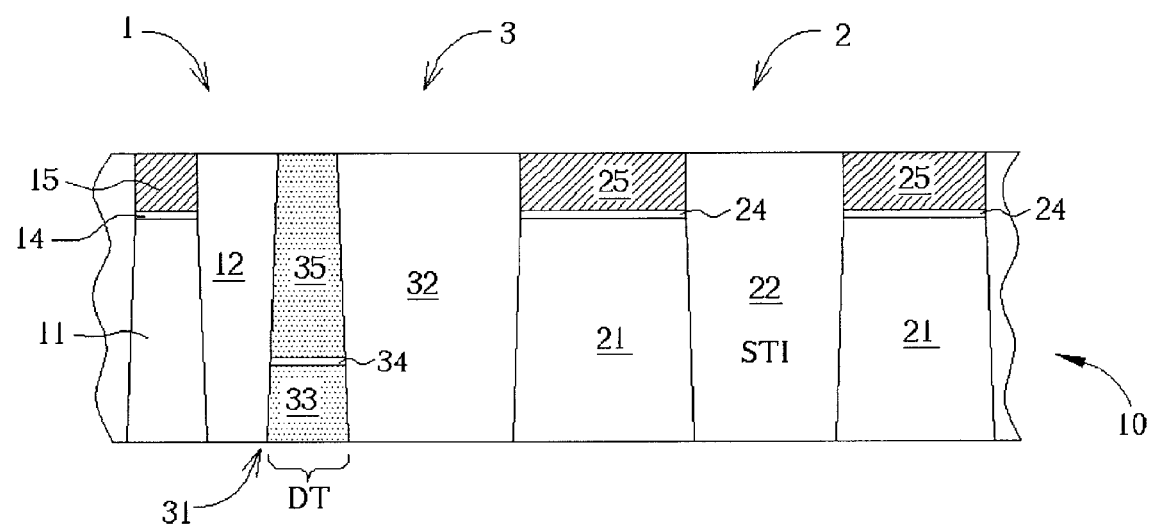
FIG. 1 is a cross sectional view illustrating a semiconductor substrate after finishing active areas, shallow trench isolation regions, and after CMP planarization.

Please refer to FIG. 1 to FIG. 10. FIG. 1 to FIG. 10 are sectional schematic diagrams illustrating a method for making a vertical transistor DRAM device according to the present invention. FIG. 1 is a cross sectional view illustrating a semiconductor substrate 10 after finishing active areas 11 and 21, shallow trench isolation (STI) regions 12, 22, and 32, and after CMP planarization. After CMP process, the semiconductor substrate 10 has a substantially planar topology. The main surface of the planar semiconductor substrate 10 comprises a vertical MOSFET array region 1, a support region 2, and a transition region 3 between the vertical MOSFET array region 1 and the support region 2. A plurality of vertical transistor memory cells 31 and a plurality of active areas 11 are disposed in the vertical MOSFET array region 1. As indicated, the vertical transistor memory cell 31 is isolated from the active area 11 with STI region 12. A plurality of active areas 21, which are isolated from each other with STI regions 22, are disposed in the support region 2. On each of the active areas 11, there is a pad oxide 14 and a pad nitride 15, and on each of the active areas 21, there is a pad oxide 24 and pad nitride 25. The structure of the vertical transistor memory cell 31 is known in the art. The vertical transistor memory cell 31 comprises a storage node 33, trench top oxide (TTO) 34, and polysilicon gate 35 of the vertical transistor, wherein the TTO 34 is used to isolate the storage node 33 from the polysilicon gate 35.

Figure 2:
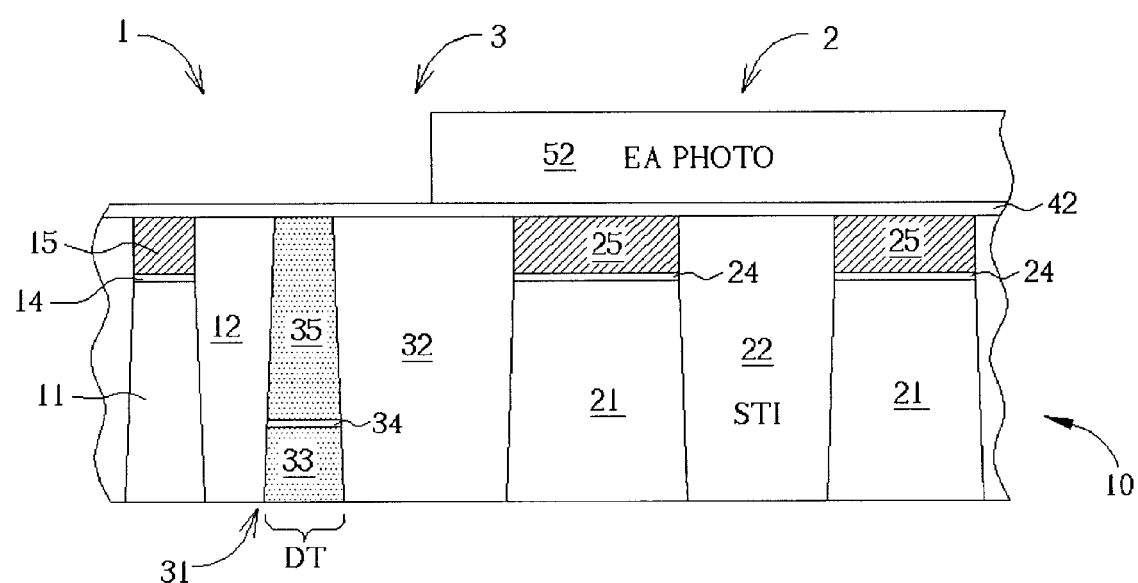
FIG. 2 is a cross sectional view illustrating the semiconductor substrate after depositing thereon a protective dielectric layer and a patterned etch array (EA) photoresist layer.

FIG. 2 is a cross sectional view illustrating the semiconductor substrate 10 after depositing thereon a protective dielectric layer 42 and a patterned etch array (EA) photoresist layer 52. In accordance with the preferred embodiment of the present invention, the protective dielectric layer 42 is made by using a conventional high-density plasma chemical vapor deposition (HDPCVD) process. Preferably, the protective dielectric layer 42 has a thickness of 500~1000 angstroms, more preferably, 750 angstroms. Optionally, before depositing the protective dielectric layer 42, an HFEG (hydrofluoric ethylene glycol) may be used to etch away 50~200 angstroms, preferably 100 angstroms of pad nitride 25. This promotes the performance of the subsequent CMP process. The HDP protective layer 42 is used to protect the pad nitride 25 in the support region 2 from hot phosphoric acid solution that is used to remove the pad nitride 15 in the vertical MOSFET array region 1. As shown in FIG. 2, the patterned EA photoresist layer 52, which is coated on the protective dielectric layer 42, masks the support region 2 and a portion of the transition region 3.

Figure 3:
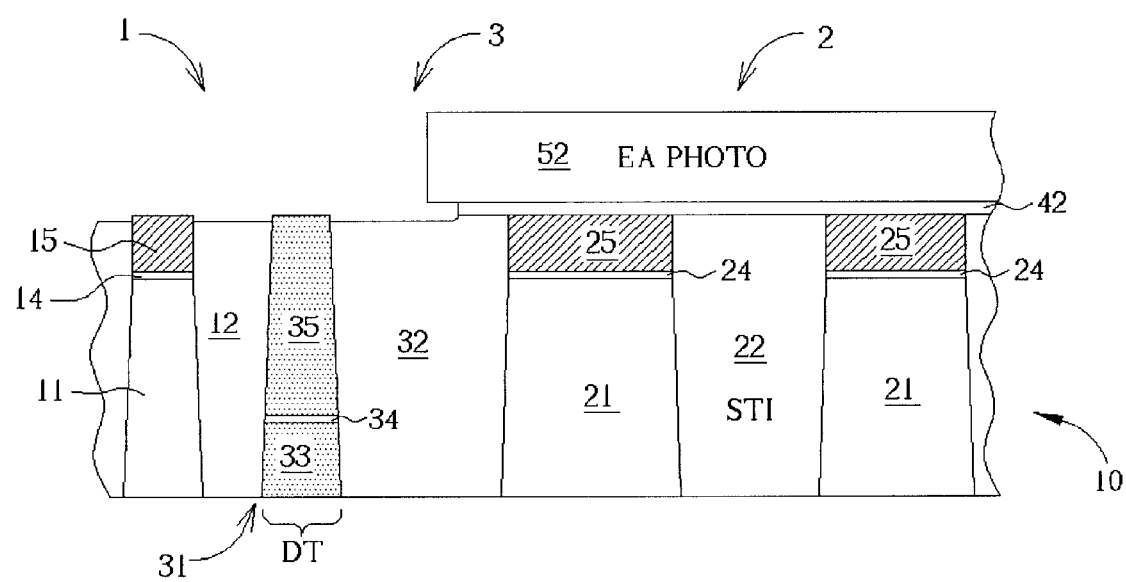
FIG. 3 is a cross sectional view illustrating the semiconductor substrate after exposing the pad nitride in the vertical MOSFET array region.

As shown in FIG. 3, using the EA photoresist layer 52 as an etching mask, an etching process such as an isotropic wet etching is carried out to etch the protective dielectric layer 42, thereby exposing the pad nitride 15 in the vertical MOSFET array region 1. Thereafter, optionally, buffered hydrofluoric acid (BHF) is used to deglaze the open vertical MOSFET array region 1 for cleaning up oxide residuals or the like.

Figure 4:
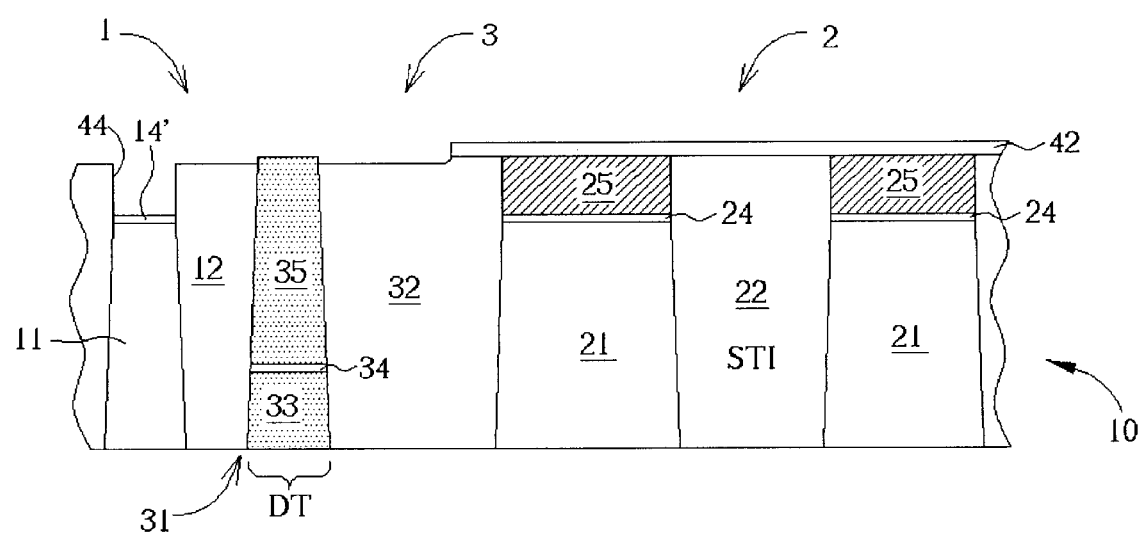
FIG. 4 is a cross sectional view illustrating the semiconductor substrate after removing the pad nitride and pad oxide in the vertical MOSFET array region and the EA photoresist.

As shown in FIG. 4, the EA photoresist layer 52 is stripped. The pad nitride 15 in the open vertical MOSFET array region 1 is removed by hot phosphoric acid to form recesses 44, while the pad nitride 25 in the support region 2 is protected by the protective dielectric layer 42. After removing the pad nitride 15, the pad oxide 14 in the open vertical MOSFET array region 1 is removed using techniques known in the art. A new pad oxide 14" is then formed.

Figure 5:
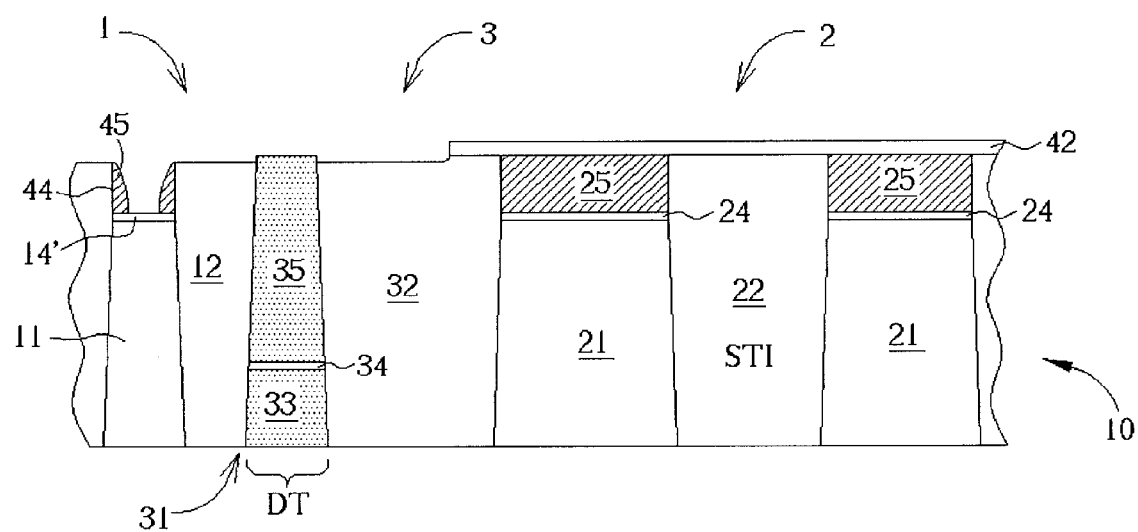
FIG. 5 is a cross sectional view illustrating the semiconductor substrate after the formation of spacers.

As shown in FIG. 5, spacers 45 are formed on walls of the recesses 44. Preferably, the spacers 45 are silicon nitride spacers. To form the spacers 45, a 350-angstrom thick silicon nitride layer (not shown) is deposited on the surface of the semiconductor substrate 10. The silicon nitride layer covers sidewalls and bottom of the recesses 44. Then, an anisotropic etching is performed to etch the silicon nitride layer.

Figure 6:
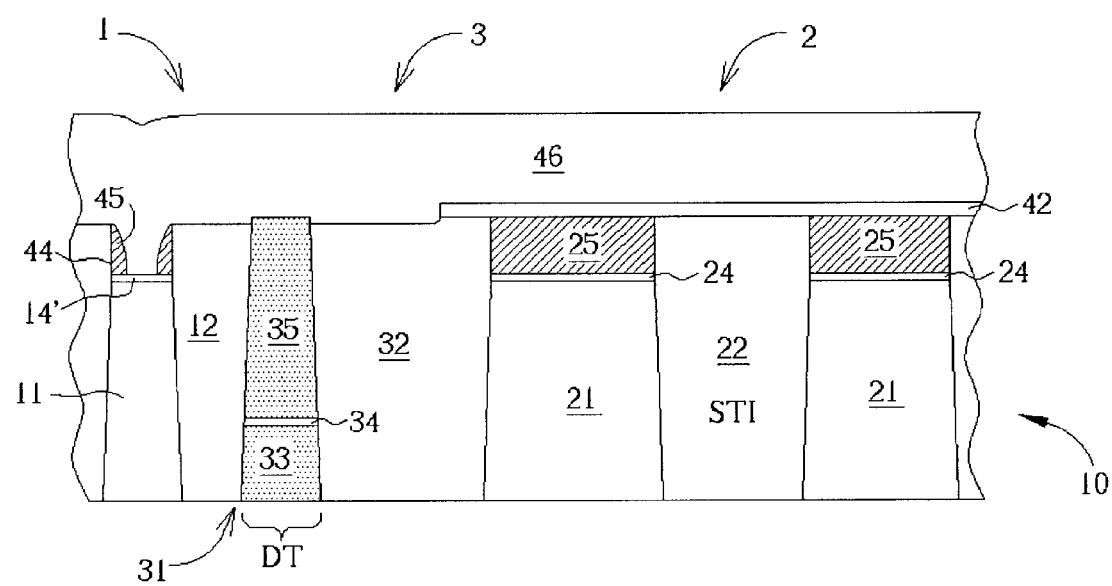
FIG. 6 is a cross sectional view illustrating the semiconductor substrate after the deposition of HDPCVD layer.

As shown in FIG. 6, a HDPCVD process is carried out to deposit a HDPCVD layer 46 over the surface of the semiconductor substrate 10. The HDPCVD layer 46 covers the vertical MOSFET array region 1, the protective dielectric layer 42 on the support region 2, and the transition region 3, and fills the recesses 44.

Figure 7:
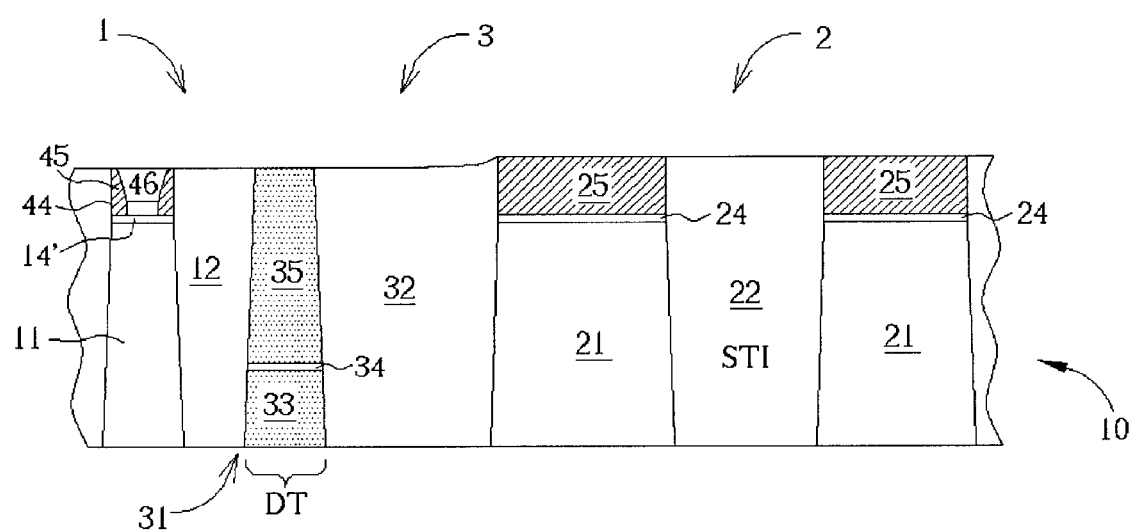
FIG. 7 is a cross sectional view illustrating the semiconductor substrate after CMP planarization and planar surface at transition region.

As shown in FIG. 7, a chemical mechanical polishing (CMP) process is implemented to polish the HDPCVD layer 46 and the protective dielectric layer 42 using the pad nitride 25 as polishing stop layer, thereby exposing the polysilicon gate 35 of the vertical transistor memory cell 31 within the transition region 3.

Figure 8:
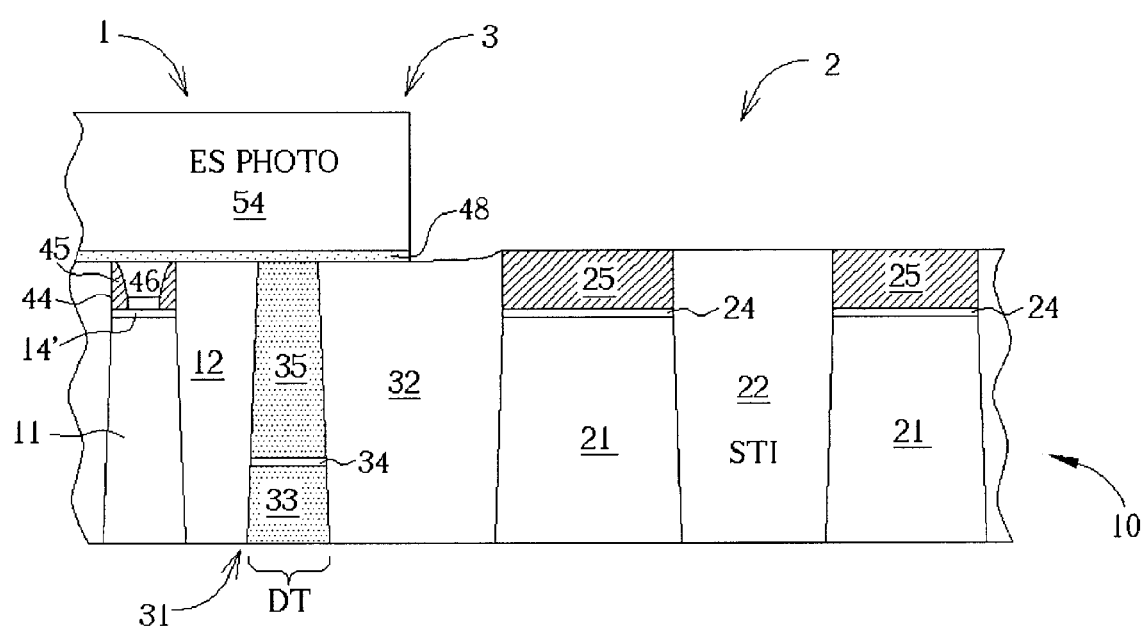
FIG. 8 is a cross sectional view illustrating the semiconductor substrate after the formation of silicon array etch mask.

As shown in FIG. 8, a silicon layer (not shown) is then deposited over the semiconductor substrate 10. The silicon layer may be a polysilicon layer or an amorphous silicon layer. As indicated, a patterned etch support (ES) photoresist layer 54 is coated on the silicon layer to mask the vertical MOSFET array region 1 and a portion of the transition region 3. Then, using the patterned ES photoresist layer 54 as an etching mask, an etching process is carried out to etch the silicon layer so as to define an array etch mask 48. The ES photoresist layer 54 is then stripped.

Figure 9:
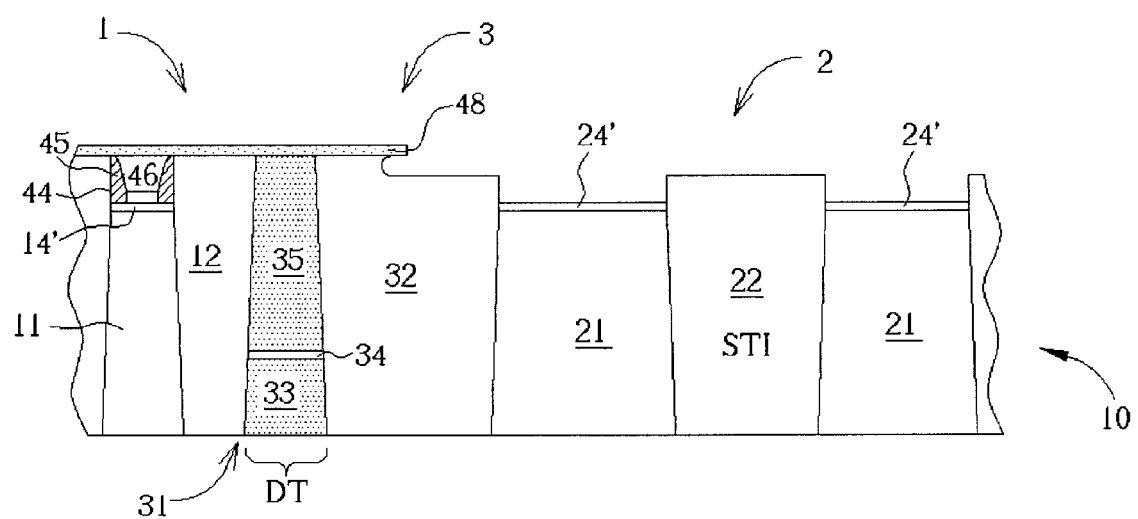
FIG. 9 is a cross sectional view illustrating the semiconductor substrate after the removal of ES photoresist and removal of pad nitride and pad oxide in the support region.
Figure 10:
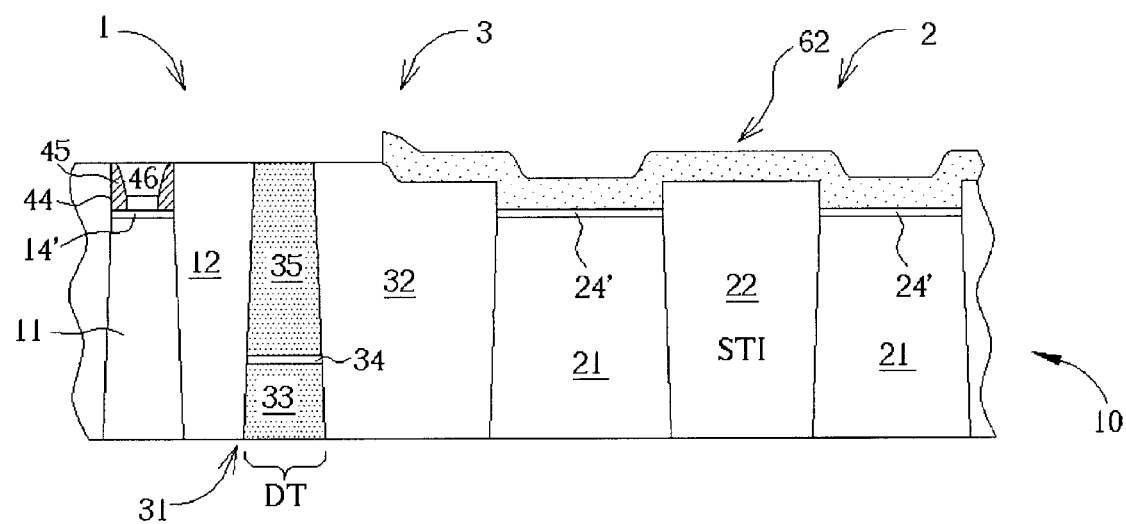
FIG. 10 is a cross sectional view illustrating the semiconductor substrate after the definition of gate lines in the support region.

As shown in FIG. 9, using the array etch mask 48 to protect the vertical MOSFET array region 1, the pad nitride 25 and pad oxide 24 in the support region 2 are sequentially removed. The removal of the pad nitride 25 and pad oxide 24 may be completed by technique known in the art. For example, the pad nitride 25 may be removed by hot phosphoric acid. The pad oxide 24 may be removed by diluted hydrofluoric acid. Optionally, before removing the pad nitride 25, 40:1 (water/HF in volumetric ratio) BHF solution is used to deglaze the surface of the semiconductor substrate 10 for cleaning oxide residuals in the support region 2. After removing the pad oxide 24, a thermal oxidation process is performed to form a sacrificial oxide layer 24" on the active areas 21 within the support region 2. According to the preferred embodiment of the present invention, after going through so many chemical cleaning steps, the trench isolation structure of the support region 2 might be eroded and seams or cracks (not shown) may be formed between the trench isolation structure 22 and the active areas 21. To eliminate such defects, after removal of the pad oxide 24, a silicon nitride re-fill process can be performed. As shown in FIG. 10, the array etch mask 48 is then removed. Gate line pattern 62 is formed in the support region 2.

To sum up, the present invention provides a process for planarizing array top oxide (ATO) in vertical MOSFET DRAM arrays. In contrast to the prior art ARC-RIE planarization method for EA/ES (etch array/etch support) module, the present invention takes advantage of chemical mechanical polishing (CMP) technique to overcome residue problems that used to occur at the transition region 3 or array edge.

Those skilled in the art will readily observe that numerous modifications and alterations of the present invention method may be made while retaining the teachings of the invention. Accordingly, the above disclosure should be construed as limited only by the metes and bounds of the appended claims.

What is claimed is:

1. A method for fabricating a vertical transistor DRAM device, comprising:

providing a semiconductor substrate comprising a vertical transistor memory array region, a support region, and a transition region between the vertical transistor memory array region and the support region, wherein the vertical transistor memory array region comprises a plurality of vertical transistor memory cells and a plurality of array active areas, the support region comprises a plurality of support active areas isolated from each other by shallow trench isolation regions, and wherein a first pad oxide and a first pad nitride are formed on each of the array active areas, and a second pad oxide and second pad nitride are formed on each of the support active areas;

depositing a protective dielectric layer over the semiconductor substrate;

coating and patterning an etch array (EA) photoresist layer on the protective dielectric layer, so that the EA photoresist layer is masking the support region and a portion of the transition region;

using the EA photoresist layer as an etching mask and etching the protective dielectric layer to expose the first pad nitride in the vertical transistor memory array region;

stripping the EA photoresist layer;

using the protective dielectric layer to protect the second pad nitride in the support region and removing the first pad nitride in the vertical transistor memory array region to form recesses on the array active areas;

forming spacers on walls of the recesses on the array active areas;

depositing a dielectric layer covering the protective dielectric layer on the support region, the vertical transistor memory array region, and the transition region, and the dielectric layer filling the recesses; and performing a chemical mechanical polishing (CMP) process to polish the dielectric layer and the protective layer on the support region using the second pad nitride as a polishing stop layer.

2. The method of claim 1 wherein after the CMP process, the method further comprises the following steps:

depositing a silicon layer over the semiconductor substrate;

coating and patterning an etch support (ES) photoresist layer on the silicon layer, the ES photoresist layer masking the vertical transistor memory array region and a portion of the transition region;

etching the silicon layer using the ES photoresist layer as a hard mask to define an array etch mask; and stripping the ES photoresist layer.

3. The method of claim 2 wherein after stripping the ES photoresist layer, the method further comprises the following steps:

using the array etch mask to protect the vertical transistor memory array region and removing the second pad nitride and second oxide in the support region, thereby exposing the support active areas;

performing a thermal oxidation process to grow a sacrificial oxide layer on the exposed support active areas; and removing the array etch mask.

4. The method of claim 2 wherein the silicon layer is polysilicon layer.

5. The method of claim 2 wherein the silicon layer is amorphous silicon layer.

6. The method of claim 1 wherein the vertical transistor memory cell comprises a storage node, trench top oxide (TTO), and polysilicon gate of the vertical transistor, and wherein the TTO is used to isolate the storage node from the polysilicon gate of the vertical transistor.

7. The method of claim 1 wherein before depositing the protective dielectric layer, HFEG (hydrofluoric ethylene glycol) is used to etch away a predetermined thickness of the second pad nitride.

8. The method of claim 7 wherein the predetermined thickness of the second pad nitride is 50~200 angstroms.

9. A method for fabricating a vertical transistor DRAM device, comprising:

providing a semiconductor substrate comprising a vertical transistor memory array region, a support region, and a transition region between the vertical transistor memory array region and the support region, wherein the vertical transistor memory array region comprises a plurality of array active areas, the support region comprises a plurality of support active areas, and wherein a first pad oxide and a first pad nitride are formed on each of the array active areas, and a second pad oxide and second pad nitride are formed on each of the support active areas;

depositing a protective dielectric layer over the semiconductor substrate;

coating and patterning an etch array (EA) photoresist layer on the protective dielectric layer, so that the EA photoresist layer is masking the support region and a portion of the transition region;

using the EA photoresist layer as an etching mask and etching the protective dielectric layer to expose the first pad nitride in the vertical transistor memory array region;

stripping the EA photoresist layer;

removing the first pad nitride in the vertical transistor memory array region to form recesses on the array active areas;

depositing a dielectric layer covering the protective dielectric layer on the support region, the vertical transistor memory array region, and the transition region, and the dielectric layer filling the recesses;

performing a chemical mechanical polishing (CMP) process to polish the dielectric layer and the protective layer on the support region using the second pad nitride as a polishing stop layer;

depositing a silicon layer over the semiconductor substrate;

coating and patterning an etch support (ES) photoresist layer on the silicon layer, the ES photoresist layer masking the vertical transistor memory array region and a portion of the transition region;

etching the silicon layer using the ES photoresist layer as a hard mask to define an array etch mask; and stripping the ES photoresist layer.

10. The method of claim 9 wherein after stripping the ES photoresist layer, the method further comprises the following steps:

using the array etch mask to protect the vertical transistor memory array region and removing the second pad nitride and second oxide in the support region, thereby exposing the support active areas;

performing a thermal oxidation process to grow a sacrificial oxide layer on the exposed support active areas; and removing the array etch mask.

* * * * *